US009356558B2

(12) United States Patent
Stoeger

(10) Patent No.: US 9,356,558 B2
(45) Date of Patent: May 31, 2016

(54) CIRCUIT, INTEGRATED CIRCUIT, RECEIVER, TRANSCEIVER AND A METHOD FOR AMPLIFYING AN INPUT SIGNAL

(71) Applicant: Intel IP Corporation, Santa Clara, CA (US)

(72) Inventor: Claus Stoeger, Linz (AT)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/686,135

(22) Filed: Apr. 14, 2015

(65) Prior Publication Data

US 2015/0381114 A1 Dec. 31, 2015

(30) Foreign Application Priority Data

Jun. 30, 2014 (DE) .......................... 10 2014 109 118

(51) Int. Cl.
| | |
|---|---|
| *H04B 1/38* | (2015.01) |
| *H03F 1/02* | (2006.01) |
| *H03F 1/34* | (2006.01) |
| *H03F 3/19* | (2006.01) |

(52) U.S. Cl.
CPC ................ *H03F 1/0205* (2013.01); *H03F 1/34* (2013.01); *H03F 3/19* (2013.01); *H03F 2200/129* (2013.01); *H03F 2200/294* (2013.01); *H03F 2200/36* (2013.01); *H03F 2200/451* (2013.01)

(58) Field of Classification Search
CPC .......... H03F 1/0205; H03F 1/34; H03F 1/19; H03F 2200/451; H03F 2200/129; H03F 2200/294; H03F 2200/36; H04B 1/38
USPC .................. 375/219, 316–319; 330/262, 265, 330/270–271, 291
See application file for complete search history.

(56) References Cited

U.S. PATENT DOCUMENTS

| | | | | |
|---|---|---|---|---|
| 4,220,040 A * | 9/1980 | Noguchi | ............... | G01N 29/024 435/807 |
| 4,853,651 A * | 8/1989 | Voorman | ................ | H03H 11/04 330/107 |
| 5,103,281 A * | 4/1992 | Holloway | ............ | H01L 27/0722 257/370 |
| 5,859,561 A * | 1/1999 | Vanoli | ........................ | G01L 9/12 310/319 |
| 8,237,502 B2 * | 8/2012 | Yuasa | ...................... | H03F 1/086 330/259 |
| 8,688,055 B2 * | 4/2014 | Brunn | ................. | H03F 3/45188 330/269 |
| 8,742,849 B1 * | 6/2014 | Gupta | ..................... | H03F 1/301 330/277 |
| 2009/0066416 A1 * | 3/2009 | Adachi | ................... | H03F 1/308 330/255 |
| 2009/0096523 A1 * | 4/2009 | Ide | ....................... | H03F 3/45183 330/257 |

(Continued)

FOREIGN PATENT DOCUMENTS

| | | |
|---|---|---|
| DE | 43 07 856 A1 | 9/1994 |
| EP | 0620648 A2 | 10/1994 |

OTHER PUBLICATIONS

Sen, et al. "Orthogonally Tunable Inductorless RF LNA for Adaptive Wireless Systems", IEEE, 2011, pp. 285-288.

(Continued)

*Primary Examiner* — Khanh C Tran
(74) *Attorney, Agent, or Firm* — Eschweiler & Associates, LLC

(57) ABSTRACT

A circuit according to an example includes an immitance converter amplifier based on a plurality of transistors of a first conductivity type and a supply transistor coupled between an output of the immitance converter amplifier and a supply for a supply potential, the supply transistor being a transistor of a second conductivity type complementary to the first type.

23 Claims, 5 Drawing Sheets

(56) References Cited

U.S. PATENT DOCUMENTS

2011/0285464 A1    11/2011  Montalvo et al.
2014/0306768 A1*   10/2014  Wang .................. H03F 3/45183
                                                            330/297

OTHER PUBLICATIONS

Wang, et al. "A 0.1—4GHz Resistive Feedback LNA with Feedforward Noise and Distortion Cancelation", IEEE, 2010, pp. 406-409.

Wang, et al. "A Wideband Inductorless LNA with Local Feedback and Noise Cancelling for Low-Power Low-Voltage Applications", IEEE Transactions on Circuits and Systems—I: Regular Papers, vol. 57, No. 8, Aug. 2010, pp. 1993-2005.

Bruccoleri, Federico, "Wide-Band Low-Noise Amplifier Techniques in CMOS", 2003, Federico Bruccoleri, Enschede, The Netherlands, 181 pgs.

Belostotski, et al. "Wideband LNA With an Active -C Element.", IEEE Microwave and Wireless Components Letters, vol. 22, No. 10, Oct. 2012.

Translation of German Office Action for Application No. 10 2014 109 118.3, dated Mar. 13, 2015.

* cited by examiner

CIRCUIT, INTEGRATED CIRCUIT, RECEIVER, TRANSCEIVER AND A METHOD FOR AMPLIFYING AN INPUT SIGNAL

CROSS REFERENCE TO RELATED APPLICATIONS

This application claims priority to German Application number 10 2014 109 118.3 filed on Jun. 30, 2014.

FIELD

The present disclosure relates to a circuit, an integrated circuit, a receiver, a transceiver and a method for amplifying an input signal.

BACKGROUND

In many receiver or transceiver applications, an amplifier is used to amplify a signal received prior to processing the amplified signal further, for instance, by downmixing the signal and further amplifying or otherwise processing the signal in an intermediate frequency or low frequency domain. In today's single stage received topologies, the amplifiers RF output signal (RF=radio frequency) is typically directly fed via a mixer to a trans-impedance-amplifier (TIA). In such a scenario, the amplifier's output impedance becomes one of many parameters, which may determine the over-all performance of such a topology.

However, also in other topologies, amplifiers are used to amplify received signals before further processing them, for instance, by downmixing, amplifying, filtering and so on. Also in these applications matching the impedances of the components, circuits or parts of circuits may become an important design goal.

Since a tendency exists to use more and more amplifier circuits in a single application to be compatible, for instance, with more than just one transmission technology, the available space becomes scarce for implementing amplifiers.

To counteract the number of amplifiers to be implemented, a tendency exists to implement amplifiers having wideband inputs, which may increase their configurability and have the potential to reduce the number of inputs. Naturally, also energy dissipation or energy consumption is especially in mobile applications an important key factor.

SUMMARY

Therefore, a demand exists to improve a trade-off between performance-related parameters, such as gain, bandwidth, noise and linearity, energy consumption of the amplifier and of the system comprising the amplifier, space used up by the amplifier and the system comprising the amplifier and flexibility and configurability of the over-all implementation.

This demand may be satisfied by a circuit, an integrated circuit, a receiver, a transceiver, a method for amplifying an input signal or a computer- or processor-related implementation according to an independent claim.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
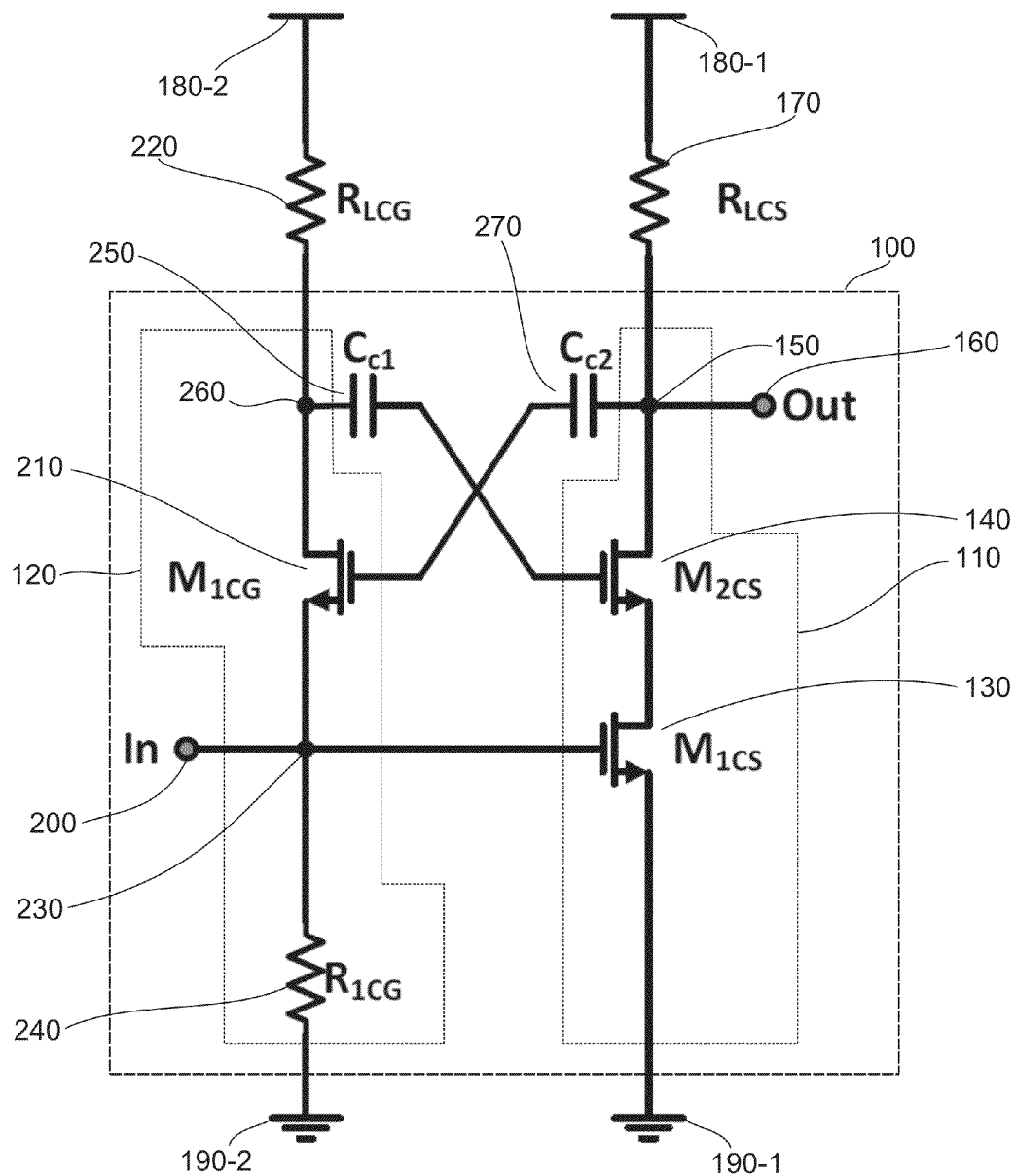
FIG. 1 shows a schematic diagram of an immitance converter amplifier.

Various examples will now be described more fully with reference to the accompanying drawings in which some examples are illustrated. In the figures, the thicknesses of lines, layers and/or regions may be exaggerated for clarity.

Accordingly, while examples are capable of various modifications and alternative forms, the illustrative examples in the figures will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures. Moreover, summarizing reference signs will be used to refer to more than one structure, element or object or to describe more than one structure, element or object at the same time. Objects, structures and elements referred to by the same, a similar or a summarizing reference sign may be identically implemented. However, one, some or all properties, features and dimensions may also vary from element to element.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

As indicated above, in modern receiver or transceiver applications and topologies a number of different design goals with partially contradicting impacts have to be balanced out for a specific application in mind. These competing design goals typically lead to a trade-off between many parameters, some of which will be outlined below in more detail.

For instance, a receiver or a transceiver in a modern application typically has to provide the yet arising number of inputs. The number of inputs may be as high as 16 main and 16 diversity receiver inputs and may still climb in future applications. As a consequence, size and form factor of integrated circuits used and their packages is determined by their contact structures such as contacting balls, pins or the like needed to connect their inputs and/or outputs to the further infrastructure of the transceiver or receiver. To reduce the number of inputs, changing from differential to single-ended inputs is becoming a tendency.

However, the external components need to match the receiver or transceiver inputs influence area, price and routability to RF engine (RF=radio frequency) used to further process the received signals. A receiver or transceiver, which provides self-matched inputs, may allow to get rid of at least some of the external components used today for impedance matching. This may help to lower the overall price and area of the amplifier, the system comprising the amplifier and, possibly, its RF-engine. For instance, in today's single stage receiver topologies, the amplifiers RF output signal current is directly fed via a passive mixer, which may be implemented as a 25% duty-cycle mixer, to a trans-impedance amplifier (TIA). This illustrates why so much attention is typically paid to the amplifier's output impedance in implementations.

An important reason for the huge number of receiver inputs required today is that in today's implementations each port is typically only capable of supporting a specific range of bands. A receiver or transceiver providing self-matched wideband inputs may not only be able to increase the configurability of such a system, but it may also have the potential to reduce the number of inputs. Current amplifiers including low noise amplifiers (LNA) make heavy use of on-chip inductors and transformers. This may lead to an unacceptable high number of inputs and chip area, which may disqualify them for being used in future receivers and transceivers. For instance, the chip area consumed by an inductor and/or transformer times the number of inputs may lead to a significant amount of chip area, when the number of inputs is still climbing as discussed before. Therefore, using coilless circuits may be a significant design challenge to be faced in future amplifiers and circuits.

A coilless low noise amplifier may lead to improving the trade-off discussed above significantly. Naturally, depending on the application in mind, it may be helpful to find an amplifier, which is compliant to the respective technologies. For instance, in the following description, an implementation of a circuit will be described, which may be made compliant to all known 3GPP releases.

An approach to improve the previously described trade-off is to use an amplifier circuit based on an immitance converter. In the following description, examples will be described and explained in more detail on the basis of field effect transistors or, to be even more precise, on the basis of metal oxide semiconductor field effect transistors (MOSFET). However, examples are by far not limited to be implemented based on field effect transistors. They can equally well be implemented based on bipolar transistors or any transconductance providing or allowing device.

Therefore, to simplify the description, in the following the examples will be described in terms of general transistors, leaving the special terminology for field effect transistors (FET) or bipolar transistors out. As a consequence, a source or source terminal of a field effect transistor, which may be substituted by an emitter terminal of a corresponding bipolar implementation, will be referred to as "inflow" or "inflow terminal", since the source and the emitter are used to provide the corresponding charge carriers to the transistor. Correspondingly, instead of using the term "drain" or "drain terminal" and "collector" or "collector" terminal for a bipolar transistor implementation, the more general term "sink" or "sink terminal" will be used. The terms "gate" or "gate terminal" of a field effect transistor and "base" or "base terminal" of a bipolar transistor are generalized and summarized by the term "control" or "control" terminal.

Accordingly, in the following description, terms derived from specific field effect transistor-related implementations or bipolar transistor-related implementations will be generalized by using the terms "inflow" instead of "source" and "emitter", "sink" instead of "drain" and "collector", and "control" instead of "gate" and "base" for field effect transistor-related implementations and bipolar transistor-related implementations, respectively.

Naturally, although in the following the immitance converter will be described in terms of n-channel field effect transistors, not only npn-bipolar transistors may be used, but also a complementary implementation based on p-channel field effect transistors or pnp-bipolar transistors may be used. This may, for instance, result in slight modifications of the examples, for instance, a kind of "inversion" of the circuitry with respect to the potentials, for instance, the supply potentials.

As a consequence, instead of describing, for instance, an n-channel field effect transistor, such a transistor may, for instance, be referred to as a transistor of a first conductivity type. Correspondingly, a p-channel transistor may be referred to as a transistor of a second conductivity type complementary to the first type. Naturally, instead of the first conductivity type referring to n-channel transistors, the first conductivity type may also be in another example a p-channel transistor. Correspondingly, in such an implementation a transistor of a second conductivity type may be a p-channel transistor. The same also applies to bipolar transistors. For instance, an npn-transistor may be in one example a transistor of a first conductivity type, while in the same example a pnp-transistor is a transistor of a second conductivity type. As described before, the roles of a first and second conductivity types may be switched. Hence, in another example a pnp-transistor may be a transistor of a first conductivity type and an npn-transistor may be a transistor of the second conductivity type.

Conventional solutions described in the context of being able to process wideband signals, being self-matched, coilless and single-ended may be subdivided to employ three basic principles or layouts. First of all, a corresponding amplifier may be based on a common control amplifier such as a common gate amplifier (CG) or a common base amplifier. Second, a common inflow amplifier may be used, for instance, a common source amplifier (CS) or a common emitter amplifier, each accompanied with a corresponding feedback trace. As a third design, a weighted combination of both of the previously mentioned amplifier techniques may be used, such as a combination of a common gate amplifier and a common source amplifier (CS+CG).

However, despite the heavy use of various smart noise and/or distortion technologies, these implementations have not been able to break the basis bandwidth versus gain versus noise versus linearity dilemmas associated with conventional common source amplifiers and common gate amplifiers, which form a basis for a solution to the requirements listed above.

However, an amplifier circuit based on an immitance converter has shown to have the potential to break the described dilemmas. To illustrate the basic layout of an immitance converter amplifier on the basis of a MOS immitance converter (MIC), FIG. 1 shows a simplified circuit diagram of an immitance converter amplifier 100. To be a little more precise, the immitance converter amplifier 100 is capable of being operated as a low noise amplifier and comprises a common inflow amplifier circuit 110 as well as a common control amplifier circuit 120. Both, the common inflow amplifier circuit 110 as well as the common control amplifier circuit 120 are based on transistors of a common conductivity type, which is referred to in the following as the first conductivity type. As will be described in more detail below, in the examples depicted in FIG. 1 the first conductivity type refers to transistors based on an electron-based charge transport. Here, the transistors are n-channel field effect transistors or—in another example—npn-bipolar transistors.

To be a little more precise, the common inflow amplifier circuit 110 comprises a common inflow amplifier transistor 130, which is implemented as an n-channel field effect transistor in the example depicted here and referred to as $M_{1CS}$. The common inflow amplifier circuit 110 further comprises a further current inflow amplifier transistor 140 also implemented as n-channel field effect transistor in the example depicted here and referred to as $M_{2CS}$. The further common inflow amplifier transistor 140 is coupled with its inflow terminal to a node 150, which is coupled to an output 160 (Out) of the immitance converter amplifier 100. The node 150 is coupled via a supply resistor ($R_{LCS}$) to a supply 180-1 for a supply potential.

While the inflow terminal of the further common inflow amplifier transistor 140 is coupled to the node 150, its sink terminal is coupled to an inflow terminal of the common inflow amplifier transistor 130. A sink terminal of the common inflow amplifier transistor 130 is coupled to a further supply 190-1 for a further supply potential.

A control terminal of the common inflow amplifier transistor 130 is coupled to an input 200 of the immitance converter amplifier 100. However, the input 200 is also coupled to a common control amplifier transistor 210, which is also implemented as an n-channel field effect transistor in the example depicted in FIG. 1 and referred to as $M_{1CG}$. The input 200 of the immitance converter amplifier 100 is coupled to a sink terminal of a common control amplifier transistor 210. An inflow terminal of the common control amplifier transistor 210 is coupled via a further supply resistor 220 ($R_{LCG}$) to another supply 180-2 of a supply potential.

The input as well as the sink terminal of the common control amplifier transistor 210 and the control terminal of the common inflow amplifier transistor 130 are directly coupled or connected to a node 230 in the example depicted in FIG. 1. The node 230 is coupled via a further supply resistor 240 ($R_{1CG}$) is coupled to a further supply 190-2 for the further supply potential. The further supply potential provided via the supplies 190 to the immitance converter amplifier 100 may be a negative supply potential sometimes also referred to as $V_{SS}$, for instance, ground potential (GND). Sometimes the further supply potential is also referred to as BSS. In contrast, the supply potential provided as the supplies 180 is in the example depicted here the positive supply potential, which is sometimes also referred to as $V_{DD}$. Naturally, in other examples the roles of the supply potential and the further supply potential along with its corresponding supplies 180, 190, respectively, may be switched.

The common inflow amplifier circuit 110 and the common control amplifier circuit 120 are capacitively cross-coupled. To be a little more specific, in the example depicted in FIG. 1 the control terminal of the further common inflow amplifier transistor 140 is coupled via a first coupling capacitor 250 ($C_{C1}$) to a node 260 arranged in between the inflow terminal of the common control amplifier transistor 210 and the further supply resistor 220. Similarly, the control terminal of the common control amplifier transistor 210 is capacitively coupled via a further coupling capacitor 270 ($C_{C2}$) to node 150 and, therefore, to the output 160 of the impedance converter amplifier 100.

The capacitances $C_{C1}$ and $C_{C2}$ of the coupling capacitors 250, 270, respectively, provide mutual feedback from the common control amplifier circuit parts including, for instance, the transistor $M_{1CG}$, the resistor $R_{1CG}$ and also the supply resistor $R_{LCG}$ to the common inflow amplifier circuit part including the transistors $M_{1CS}$ and $M_{2CS}$ along with the supply resistor $R_{LCS}$. The coupling capacitors 250, 270 allow synthesizing in general everything from an inductive to negative capacitor behavior at the low noise amplifier's input 200. Due to the possibility of essentially synthesizing any behavior from a purely inductive to a negative capacitive behavior at the input 200, the immitance converter amplifier 100 bears its name.

Due to using both, a common inflow amplifier circuit 210 and a common control amplifier circuit 120, the common control amplifier circuit—or common gate part of the circuitry depicted in FIG. 1—can be designed for a larger real part of the input impedance than needed. This may help to overcome the intrinsic noise-disadvantage many common control amplifier circuits suffer from. For instance, when properly designed, this too large real part of the impedance may be reduced afterwards to match a reference impedance $Z_0$ by a mutual feedback, which will be outlined below. The reference impedance $Z_0$ may be, for instance, 50Ω, 100Ω or any other corresponding value depending on the application and usage scenario.

At the same time, the imaginary part can be equal to or close to zero (0). This may result in a wideband simultaneous noise/power-matched low noise amplifier implementation as desired.

Figure 2:
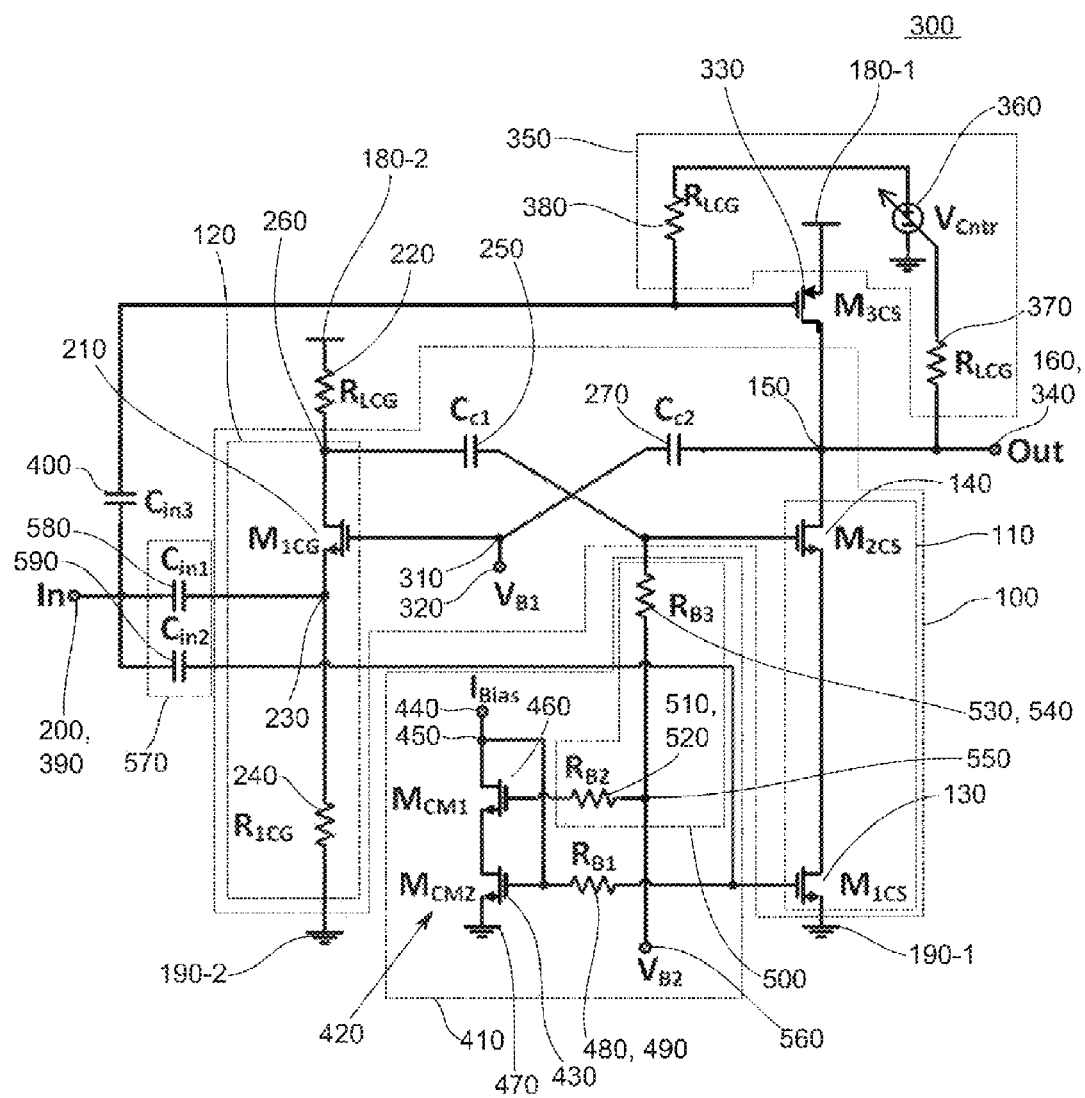
FIG. 2 shows a circuit diagram of a circuit to an example.

However, the immitance converter amplifier 100 as depicted in FIG. 2 may suffer from some fundamental limitations, which may disqualify the topology as shown in FIG. 2 from serving as a solution for the application stated above. Using an example as will be described below, may overcome these limitations at least partially or even illuminate them completely. However, before a more detailed description of a circuit according to an example will be given, a more detailed description of these fundamental drawbacks will shortly be given.

The immitance converter amplifier 100 as depicted in FIG. 1 may suffer from some essential drawbacks such as low gain, or an unsatisfactory linearity and a mediocre noise figure. For instance, by adding a second stage it may be possible to boost the gain and at the same time introduce some kind of noise and distortion cancellation. This second stage may also lead to an undesirable additional current consumption and/or—depending on the application in mind—to other undesirable performance-related parameters, such as $IIP_3$ and/or $IIP_2$ (second-order and/or third-order intercept point, respectively). Moreover, in its form as depicted, it may be unsuitable for single-state receivers employing 25% duty-cycle-mixers due to its low output impedance. Besides that, the cancellation mechanism used in the second stage may increase the risk to suffer additionally from mismatch effects, disqualifying the architecture for mass production. Moreover, in such a solution many RF parameters (RF=radio frequency) may be contradictory to DC operating point requirements (DC=direct current). Furthermore, it may have very few degrees of freedom and many conflicting dependencies may end-up in difficult and sometimes suboptimal trade-offs.

In contrast, a circuit as will be described in more detail below, may solve the intrinsic problem of low gain and low output impedance as well as bad linearity and mediocre noise figure without sacrificing current consumption by introducing a complementary gain stage reusing the DC-current of the common inflow amplifier circuit.

FIG. 2 shows a circuit diagram of a circuit 300 according to an example. The circuit 300 comprises an immitance converter amplifier 100 based on transistors of a first conductivity type. To be a little more specific, the immitance converter amplifier 100 of FIG. 2 resembles that of FIG. 1 with only small variations. Accordingly, the transistors of the first conductivity type are implemented once again as n-channel field effect transistors.

One difference between the immitance converter amplifiers 100 depicted in FIGS. 1 and 2 is that the further coupling capacitor 270 ($C_{C2}$) and the control terminal of the common control amplifier transistor 210 are coupled via a node 310 to a supply 320 for a bias potential or bias voltage $V_{B1}$. Moreover, the node 230 is not directly coupled to the control terminal of the common inflow amplifier transistor 130. However, differences following, for instance, from the difference mentioned last will be outlined in more detail below.

The circuit 300 comprises a supply transistor 330 ($M_{3CS}$), which is a transistor of a second conductivity type complementary to the first type. As a consequence, the supply transistor 330 is in the example depicted in FIG. 2 p-channel field effect transistor. In many examples the transistors of the immitance converter amplifier 100 and the supply transistor 330 share, however, the same transistor type. In other words, the transistors of immitance converter amplifier 100 as well as the supply transistor 330 are typically either field effect transistors or bipolar transistors. Nevertheless, in some examples more than just one type of transistors may be used for the transistors of the immitance converter amplifier 100 and the supply transistor 330.

The supply transistor 330 is coupled between the output 160 of the immitance converter amplifier 100, which is also the output 340 of the circuit 300, and the supply 180-1 or the supply potential. In other words, the supply transistor 330 takes the place of a supply resistor 170 depicted in FIG. 1. Due to the complementary nature of the supply transistor 330, none-linearities of the transistors of the immitance converter amplifier 100, for instance of the transistors of the common inflow amplifier circuit 110, may be cancelled out at least partially, if not completely.

In terms of the coupling of the supply transistor 330, it is coupled with its inflow terminal and its sink terminal between the supply 180-1 for the supply potential and the output 160 of the immitance converter amplifier also being the output 340 of the circuit 300. The inflow terminal is coupled to the supply 180-1 for the supply potential and the sink terminal to the output 160, 340, to be even a little more specific. As a consequence, the supply transistor 330, which is also referred to as complementary transistor $M_{3CS}$, reuses the DC current of the transistors of the common inflow amplifier circuit 110 so that a current and/or energy consumption may be limited compared to a second stage to name just one alternative implementation.

The circuit 300 further comprises an output voltage control circuit 350 which is coupled between the output 160 of the immitance converter amplifier 100 and the control terminal of the supply transistor 330 feeding back the output of the immitance converter amplifier 100 to the control terminal of the supply transistor 330. Due to the output voltage control circuit 350 it may be possible to establish a control loop, which in turn determines the circuits 300 or low noise amplifiers DC-output level from the output 160, 340 to the control terminal of the supply transistor 330 (in FIG. 2 the gate of the complementary transistor $M_{3CS}$). The output voltage control circuit 350 is here capable of generating a negative feedback loop so that the output voltage control circuit 350 may be adapted to stabilize a DC-output potential of the output of the immitance converter amplifier 100. By proper adjustment, the output voltage control circuit 350 may be used to further tune the cancellation of second order non-linearities.

The output voltage control circuit 350 as depicted in FIG. 2 comprises a controllable voltage source 360 coupled between the output 160, 340 and the control terminal of the supply transistor 330. To be a little more specific, the control terminal of the controllable voltage source 360 is coupled via a control resistor 370 ($R_{LCG}$) to the output 160, 360, while the output of the controllable voltage source 360 is coupled via a further control resistor 380 ($R_{LCG}$) to the control terminal of the supply transistor 330. A further terminal of the controllable voltage source 360 is coupled to a supply for the further supply potential. As a consequence, a change of a low-frequency component or DC-component at the output 160, 340 is fed to the control terminal of the controllable voltage source 360 via the control resistor 370 causing the controllable voltage source 360 to provide via the further control resistor 380 a signal to adjust the potential at the control terminal of the supply transistor 330. The controllable voltage source 360, hence, provides a variable voltage $V_{Cntr}$, in response to the signal received at its control terminal forming the previously mentioned negative feedback loop. The controllable voltage source 360 may, for instance, comprise an operational amplifier to name just one example.

Although in the example depicted in FIG. 2 the control resistors 370, 380 are identically implemented, in other examples different resistors may be used. Moreover, depending on the implementation, also other impedance elements may be used such as capacitors or any combination thereof.

In circuit 300 as depicted in FIG. 2, the input 200 of the immitance converter amplifier 100, which is also the input 390 of the circuit 300 (In) is coupled to the control terminal of a supply transistor 330. As a consequence, it may become possible to additionally feed the input signal present at the input 200, 290 to the complementary transistor $M_{3CS}$, which may boost the low noise amplifiers gain or—in other words—the gain of the circuit 300. Additionally or alternatively, an output impedance of a circuit 300 rises significantly compared to the implementation shown in FIG. 1 without sacrificing current consumption and noise performance.

Between the input 200, 390 and the control terminal of the supply transistor 330 a capacitor 400 ($C_{in3}$) is coupled. In other words, the input 390 of the circuit 300 is coupled to the control terminal of the supply transistor 330 or to the input 200 of the immitance converter amplifier 100 to receive a signal to be amplified.

The circuit 300 further comprises a bias control circuit 410 which is coupled to a control terminal of the common inflow amplifier transistor 130 and configured to control the current flowing through the common inflow amplifier transistor 130. To be a little more precise, the bias control circuit 410 is capable of controlling the current flowing between the inflow terminal and the sink terminal of a common inflow amplifier transistor 130.

In the circuit 300 as depicted in FIG. 2, a simple and efficient implementation is used, which requires only a small amount of additional infrastructure. To be more specific, the bias control circuit 410 uses a current mirror circuit 420 comprising a current mirror transistor 430, control terminal which is coupled to the control terminal of the common inflow amplifier transistor 130. The control mirror 420 is capable of controlling the current flowing through the common inflow amplifier transistor 130 to be proportional to a control current flowing through the current mirror transistor 430. The control current may be provided to the current mirror transistor 430 via a supply 440 for a bias current $I_{Bias}$. The current mirror transistor 430 is coupled to the supply 440 for the control current via a node 450, which couples the control terminal of the current mirror transistor 430 and—via a further current mirror transistor 460 an inflow terminal of a current mirror transistor 430 to the supply 440. To bring the current mirror circuit 420 into operation, a sink terminal of the current mirror transistor 430 is coupled to a further supply 470 for the further supply potential. Since the current mirror transistor 430 is also a transistor of a first conductivity type and of a first type as the common inflow amplifier transistor 130, the potentials of the sink terminals of these transistors may be identical during operation.

Naturally, in other implementations different transistor types and/or transistors of different conductivity types may be used.

The bias control circuit 410 further comprises a current mirror decoupling circuit element 480, which is implemented here as a resistor 490, to decouple the current mirror circuit 420 at least partially from the input 390 of the circuit 300. Naturally, in other examples instead of the resistor 490 other circuit elements such as capacitors may be used. Due to implementing the current mirror decoupling circuit element 480, it may be possible to prevent the input signal from reaching the control terminal of a current mirror transistor 430 at least partially and to couple the input signal more or less completely into the control terminal of the common inflow amplifier transistor 130 and, therefore, to the common inflow amplifier circuit 110 ($R_{B1}$). As a consequence, due to the bias control circuit 410 it is possible to determine the current in the common inflow amplifier circuit 110, which may be referred to in the case of the implementation of FIG. 2 as the CS-stage, via the current mirror biasing caused by the current mirror circuit 420 comprising the transistors $M_{CM2}$ and $M_{1CS}$ along with the resistor $R_{B1}$. Therefore, the working points of the common inflow amplifier circuit 110 may be determine by a current biasing, which may be implemented essentially independent of voltages applied to the respective transistors. This may give a greater variety and options to determining the working points of the different components of the immitance converter amplifier 100.

The current mirror circuit 420 used in the example depicted in FIG. 2 is cascoded current mirror circuit comprising the previously mentioned further current mirror transistor 460 ($M_{CM1}$). The further current mirror transistor 460 is coupled between the node 450 and the current mirror transistor 430. The control terminal of a further current mirror transistor is coupled to the control terminal of a further common inflow amplifier transistor 140. By implementing this "poor man's" low voltage cascoded current mirror circuit, which uses the common inflow amplifier circuits cascode transistor 140 ($M_{2CS}$) together with the further current mirror transistor 460, it may be possible to stabilize the potential of the sink terminal of the further common inflow amplifier transistor 140 independent of the swing of the input signal. This may lead to a more stable current biasing by the current mirror circuit 420. In other words, by implementing the cascoded current mirror circuit, the robustness of the biasing may be boosted.

The further current mirror transistor 460 is coupled to the control terminal of the further common inflow amplifier transistor 140 via a coupling circuit 500 comprising a decoupling circuit element 510. The decoupling circuit element 510 is implemented here as resistor 520 ($R_{B2}$), but may also be implemented as a different circuit element in other examples. The decoupling circuit element 510 may weaken a coupling of the control terminal of a further current mirror transistor 460 to the control terminal of a further common inflow transistor 140.

To determine more independently an operating point of the further common inflow amplifier transistor 140, the coupling circuit 500 may further comprise a further decoupling circuit element 530 forming a series connection with a decoupling element 510 of the coupling circuit 500. The further decoupling circuit element 530 is also implemented in the example depicted in FIG. 2 as a resistor 540 ($R_{B3}$). Between the decoupling circuit element 510 and the further decoupling circuit element 530 the node 550 is arranged, which is configured to be coupled to a bias potential ($V_{B2}$). Accordingly, the circuit 300 comprises a supply 560 for the bias potential to be coupled into node 550.

In other words, all the concepts presented previously have been incorporated into the example depicted in FIG. 2. Naturally, not all of these features are to be implemented in examples. However, all the improvements mentioned so far allow to introduce additional degrees of freedom and to have a highly welcome side effect that many of the RF-related performance values may be decoupled from DC operating point limitations.

Moreover, the circuit 300 as depicted in FIG. 2 further comprises an input circuit 570 comprising a first decoupling capacitor 580 ($C_{in1}$) and a second decoupling capacitor 590, which are coupled in between the input 390 of the circuit 300 and the node 230 and the control terminal of the common inflow amplifier transistor 130, respectively. As a consequence, the input 390 of the circuit 300 and, hence, the input 200 of the immitance converter amplifier 100, are both capacitively coupled to an input of the common control amplifier circuit 120 and to an input of the common inflow amplifier circuit 110. In contrast to the implementation depicted in FIG. 1, the strict binding of the potentials at the sink terminal of the common control amplifier transistor 210 and the control terminal of the common inflow amplifier transistor 130 is prevented, allowing an independent biasing and independent adjustment of the operating points as described above.

Naturally, it is imitable necessary to implement both decoupling capacitors 580, 590. In principle, implementing any of the decoupling capacitors 580, 590 may be omitable. However, it is not necessary to implement both, but, for instance, to implement just one of the decoupling capacitors 580, 590 leading to capacitor decoupling of at least one of the previously mentioned nodes and terminals to the input 390 of the circuit 300.

As mentioned above, a circuit 300 according to an example may introduce additional degrees of freedom and by this breaks the dilemma of RF-related parameters having contradictory design goals with respect to DC-related operating point requirements. It may further allow a more robust design suitable for mass production and it may be possible to solve the intrinsic problems of low gain and low output impedance, improvable linearity and mediocre noise figure of the circuitry shown in FIG. 1 without sacrificing current consumption by introducing the complementary gain stage reusing the DC-current of the common inflow amplifier circuit 100.

Proper dimensioning of the circuit 300 as depicted in FIG. 2 may allow the design of a real single-ended, self-matched, wideband and coilless low noise amplifier, which may allow an implementation of a receiver front end fully compliant to many requirements, for instance, the 3GPP standards. In other words, the circuitry depicted in FIG. 2 may be used as a remittance converter low noise amplifier implementation suitable for many applications such as RF-receivers, RF-engines and other systems.

Figure 3:
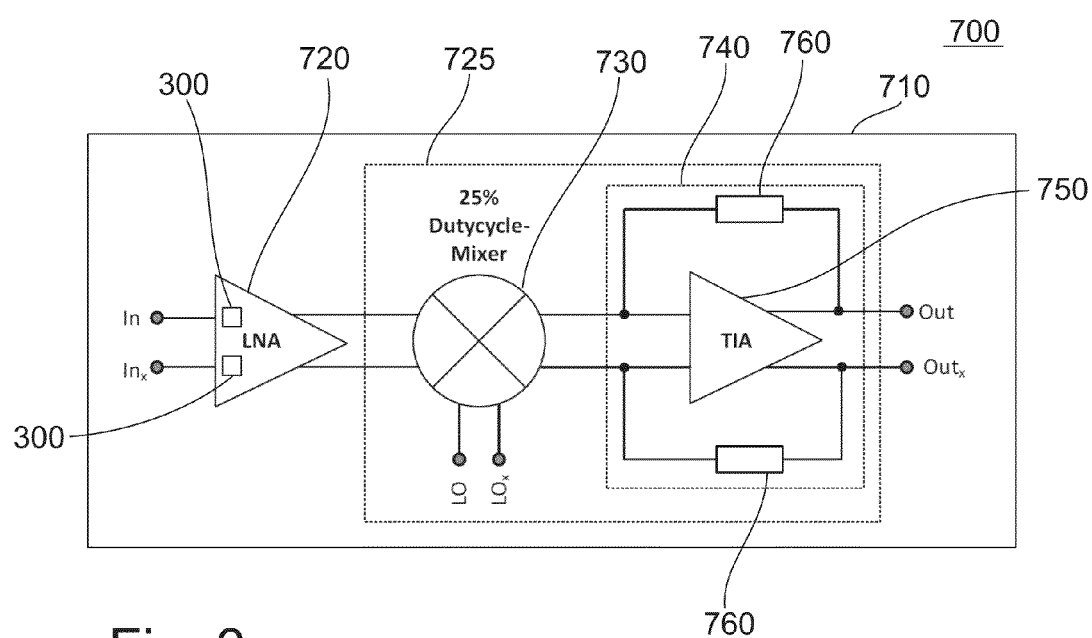
FIG. 3 shows a simplified block diagram of an integrated circuit according to an example.

FIG. 3 shows a schematic block diagram of an integrated circuit 700 according to an example. The integrated circuit 700 comprises a substrate 710, which comprises in this example a low noise amplifier 720 having multiple input ports and a corresponding number of circuits 300. However, the number of circuits 300 may be different from the number of inputs. For example, some or all input ports may share one or more circuits 300.

The integrated circuit 700 may further comprise radio-frequency digital/analog converter system 725 (RF-ADC) comprising a mixer 730 coupled to the output of the circuit 300 or—in other words—to the output of the linear amplifier 720. The mixer 730 may be implemented as a multi-channel mixer for each of the circuits 300 providing a corresponding output signal. Moreover, the mixer 730 may be, for example, a mixer with a predetermined, changeable, fixed or flexible duty cycle, for instance, a duty cycle of 25%, making it possible to use a 25%-duty-cycle mixer as one example. The integrated circuit 700 and the radio-frequency digital/analog converter system 725 may further comprise a trans-impedance amplifier 740 (AMP) comprising a trans-impedance amplifier core 750, an output of which is fed back via a corresponding impedance 760 to its input. Naturally, in the case of a multi-channel trans-impedance amplifier 740 (AMP), also the trans-impedance amplifier core 750 may comprise the corresponding number of circuit elements along with a corresponding number of impedances 760 to generate the feedback to its input. Naturally, the integrated circuit 700 may further comprise suitable inputs and outputs to couple an antenna or other components or parts of the infrastructure to the integrated circuit 700.

The substrate 710 may, for instance, be a semiconducting substrate such as the semiconductor die or the like. Naturally, also insulating substrates may be used depending on the implementation and application in mind.

FIG. 3 illustrates today's tendency of implementing single stage received topologies. Here, the low noise amplifiers RF output signal current is directly fed via the mixer 730 to a trans-impedance amplifier 740 (AMP), both the mixer 730 and the trans-impedance amplifier 740 (AMP) may be implemented as a part of the radio-frequency analog/digital converter 725, although they can easily be implemented as separate circuit elements or operational blocks. Due to this simple layout, particular attention may have to be paid to the low noise amplifiers output impedance, when searching for a implementation improving the previously mentioned trade-off.

Figure 4:
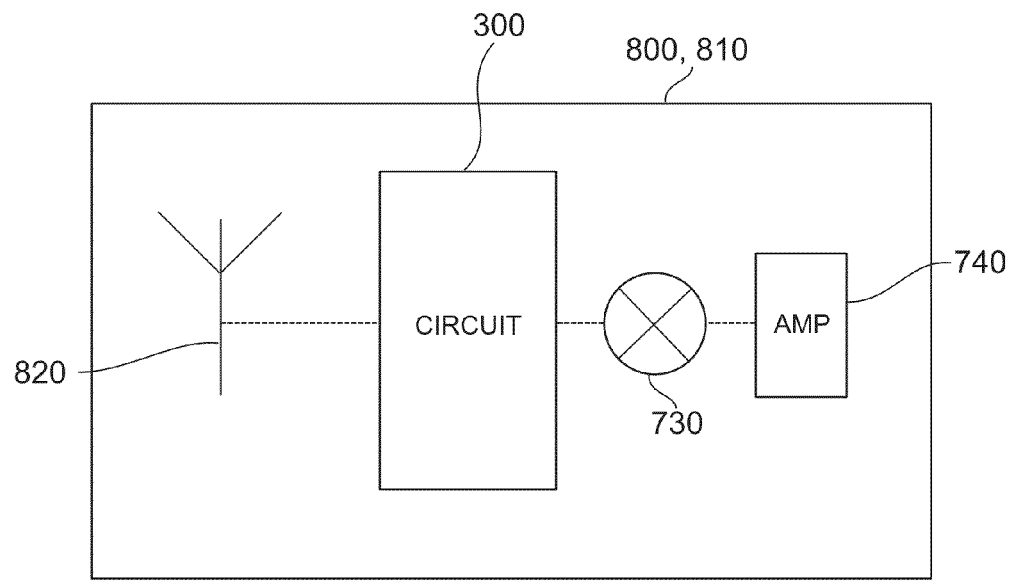
FIG. 4 shows a simplified block diagram of a receiver or a transceiver according to an example.

FIG. 4 shows a simplified block diagram of a receiver 800 or a transceiver 810 comprising an antenna 820 and at least one circuit 300 according to an example as described before. As described in the context of the integrated circuit 700, also the receiver 800 or transceiver 810 may further comprise a mixer 730, which may be a 25% duty-cycle mixer. Naturally, the transceiver 810 or receiver 800 may further comprise a trans-impedance amplifier as described before.

Examples may include a self-matched, wideband, coilless and single ended low noise amplifier for single stage receiver topologies. These low noise amplifiers may, for instance, be used in receivers or transceivers employing a single stage topology. They may also be used in products other than high volume architectures. It may comprise applications in test systems and design/debug tool may below in volume. Nevertheless, examples may be especially interesting for mass production products and other high volume systems.

A circuit 300 according to the example may allow implementing a robust single-ended, self-matched wideband and coilless low noise amplifier network enable to reduce chip and package area and, hence, the number of balls or other terminals needed to contact such packaged integrated circuit. It may further eliminate the need of external matching components as it may be implemented as a self-matched version. Moreover, it may allow implementing highly reconfigurable receiver inputs due to the large number of degrees of freedom, which can be fitted to a specific application.

Figure 5:
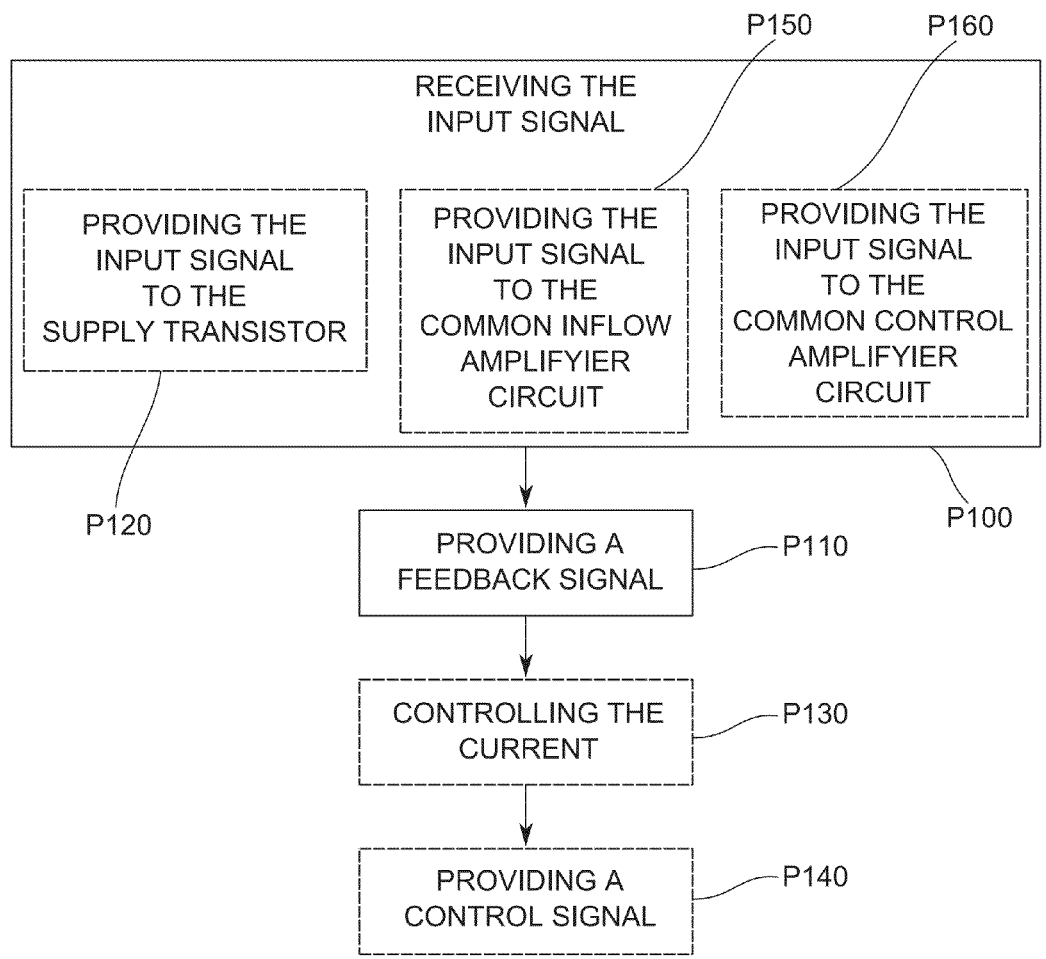
FIG. 5 shows a flowchart of a method for amplifying an input signal according to an example.

FIG. 5 shows a flowchart of a method for amplifying an input signal according to an example. In a process P100 the method comprises receiving the input signal at an input 390 of a circuit 300 as described before. The method further comprises providing a feedback signal in a process P110 based on an output signal at the output of the immitance converter amplifier 300 to control terminal of a supply transistor 330 to stabilize a DC-output potential of the output of the immitance converter amplifier 100.

Receiving the input signal may optionally comprise providing the input signal to the control terminal of a supply transistor 330 in a sub-process P120. This may, for instance, be done by capacitive coupling as described before.

Naturally, the method may further optionally comprise controlling the current flowing through the common inflow amplifier transistor 130 in an optional process P130. As described before, the current through the common inflow amplifier transistor 130 may be proportional to a control current flowing through the current mirror transistor 430. Depending on the concrete implementation of such a current mirror circuit 420, the proportionality factor may, for instance, be geometrically defined by dimensions of the corresponding transistors involved. Also other parameters including doping concentrations and other design- and/or fabrication-related parameters may influence the proportionality factor.

As described before, the current mirror circuit 420 may be a cascoded current mirror circuit such that the method according to an example may further optionally comprise providing a control signal in the described manner to influence and control the further common inflow amplifier transistor 140. This may be done in a process P140, which is also optional.

Receiving the input signal in process P100 may optionally further comprise at least one of providing the input signal also to the common inflow amplifier circuit 110, for instance, by capacitively coupling the input to the input of the common inflow amplifier circuit 110 (process P150) and providing the input signal to the common control amplifier circuit 120 in a similar fashion (process P160). Naturally, since all these processes are optional processes, it may be possible to implement an example using any combination of these processes, including, implementing both, providing the input signal to the common inflow amplifier circuit 110 (process P150) and providing the input signal to the common control amplifier circuit 120 (process P160).

It should be noted that the processes depicted in FIG. 5 may be carried out in a different order as depicted in FIG. 5 and described above. For instance, some or all of the processes may be carried out simultaneously or timely overlapping to name just some examples. Moreover, the processes may be carried out several times, for instance, in the form of a loop.

In the following examples pertain to further examples.

Example 1 is a circuit comprising an immitance converter amplifier based on a plurality of transistors of a first conductivity type; and a supply transistor coupled between an output of the immitance converter amplifier and a supply for a supply potential, the supply transistor being a transistor of a second conductivity type complementary to the first type.

In example 2, the subject matter of example 1 may optionally include the supply transistor being coupled with an inflow terminal and a sink terminal between the supply for the supply potential and the output of the immitance converter amplifier.

In example 3, the subject matter of example 2 may optionally include the inflow terminal of the supply transistor being coupled to the supply for the supply potential, and wherein the sink terminal of the supply transistor is coupled to the output of the immitance converter amplifier.

In example 4, the subject matter of any of the examples 1 to 3 may optionally include the output of the immitance converter amplifier being fed back via an output voltage control circuit to a control terminal of the supply transistor.

In example 5, the subject matter of example 4 may optionally include the output voltage control circuit being configured to generate a negative feedback loop.

In example 6, the subject matter of example 5 may optionally include the output voltage control circuit being adapted to stabilize a DC-output potential of the output of the immitance converter amplifier.

In example 7, the subject matter of any of the examples 4 to 6 may optionally include the output voltage control circuit comprising a controllable voltage source coupled between the output of the immitance converter amplifier and the control terminal of the supply transistor.

In example 8, the subject matter of any of the examples 1 to 7 may optionally include an input of the circuit being coupled to the control terminal of the supply transistor.

In example 9, the subject matter of example 8 may optionally include a capacitor being coupled between the input of the circuit and the control terminal of the supply transistor.

In example 10, the subject matter of any of the examples 1 to 9 may optionally include the immitance converter amplifier comprising a common inflow amplifier circuit comprising a common inflow amplifier transistor of the first conductivity type coupled between the output of the immitance converter amplifier and a further supply for a further supply potential, the circuit further comprising a bias control circuit coupled to a control terminal of the common inflow amplifier transistor and configured to control a current flowing through the common inflow amplifier transistor.

In example 11, the subject matter of example 10 may optionally include the bias control circuit comprising a current mirror circuit comprising a current mirror transistor, a control terminal of which is coupled to the control terminal of the common inflow amplifier transistor, wherein the current mirror circuit is configured to control the current flowing through the common inflow amplifier transistor to be proportional to a control current flowing through the current mirror transistor.

In example 12, the subject matter of any of the examples 10 or 11 may optionally include the control terminal of the common inflow amplifier transistor being coupled to an input of the circuit, and wherein the bias control circuit comprises a current mirror decoupling circuit element to decouple the current circuit mirror circuit from the input of the circuit.

In example 13, the subject matter of example 12 may optionally include the current mirror decoupling circuit element comprising a resistor.

In example 14, the subject matter of any of the examples 11 to 13 may optionally include the common inflow amplifier circuit being a cascoded common inflow amplifier circuit comprising a further common inflow amplifier transistor of the first conductivity type coupled between the output of the immitance converter amplifier and the common inflow amplifier transistor, wherein the current mirror circuit is a cascoded current mirror circuit comprising a further current mirror transistor coupled between a node, to which the control terminal of the current mirror transistor is coupled, and the current mirror transistor, and wherein the control terminal of the further current mirror transistor is coupled to a control terminal of the further common inflow amplifier transistor.

In example 15, the subject matter of example 14 may optionally include 15 the control terminal of the further current mirror transistor being coupled to the control terminal of the further common inflow amplifier transistor via coupling circuit, the coupling circuit comprising a decoupling circuit element to weaken a coupling of the control terminal of the further current mirror transistor to the control terminal of the further common inflow transistor.

In example 16, the subject matter of example 15 may optionally include the decoupling circuit element of the coupling circuit being a resistor.

In example 17, the subject matter of any of the examples 15 or 16 may optionally include the coupling circuit further comprising a further decoupling element forming a series connection with the decoupling element of the coupling circuit coupled between the control terminal of the further current mirror transistor and the control terminal of the further common inflow transistor, wherein the series connection further comprises a node configured to be coupled to a bias potential.

In example 18, the subject matter of example 17 may optionally include the further decoupling element of the coupling circuit being a resistor.

In example 19, the subject matter of any of the examples 10 to 18 may optionally include the immitance converter amplifier further comprising a common control amplifier circuit, the common control amplifier circuit and the common inflow amplifier circuit being capacitively cross-coupled, wherein an input of the circuit is capacitively coupled to at least one of an input of the common control amplifier circuit and an input of the common inflow amplifier circuit.

In example 20, the subject matter of example 19 may optionally include the input of the circuit being capacitively coupled to the input of the common control amplifier circuit and to the input of the common inflow amplifier circuit.

Example 21 is an integrated circuit comprising a substrate comprising a circuit according to any of the examples 1 to 20.

In example 22, the subject matter of examples 21 may optionally include a mixer coupled to the output of the circuit.

In example 23, the subject matter of example 22 may optionally include the mixer is a mixer with a predetermined, changeable, fixed or flexible duty cycle In example 24, the subject matter of any of the examples 22 or 23 may optionally include a transimpedance amplifier coupled to an output of the mixer. Optionally, at least one of the transimpedance amplifier and the mixer may be integrated in a radio-frequency analog/digital converter system.

Example 25 is a receiver or a transceiver comprising an antenna; and a circuit according to any of the examples 1 to 20, wherein the antenna is coupled to an input of the circuit.

In example 26, the subject matter of example 25 may optionally include a mixer coupled to the output of the circuit.

In example 27, the subject matter of example 26 may optionally include the mixer being a mixer with a predetermined, changeable, fixed or flexible duty cycle.

In example 28, the subject matter of any of the examples 26 or 27 may optionally include a transimpedance amplifier coupled to an output of the mixer. Optionally, at least one of the transimpedance amplifier and the mixer may be integrated in a radio-frequency analog/digital converter system.

Example 29 is a method for amplifying an input signal, the method comprising receiving the input signal at an input of a circuit, the circuit comprising an immitance converter amplifier based on a plurality of transistors of a first conductivity type, and a supply transistor coupled between an output of the immitance converter amplifier and a supply for a supply potential, the supply transistor being a transistor of a second conductivity type complementary to the first type; and providing a feedback signal based on an output signal at the output of the immitance converter amplifier to a control terminal of the supply transistor to stabilize a DC-output potential of the output of the immitance converter amplifier.

In example 30, the subject matter of example 29 may optionally include receiving the input signal comprising providing the input signal to the control terminal of the supply transistor.

In example 31, the subject matter of example 30 may optionally include providing the input signal to the control terminal of the supply transistor comprising providing the input signal to the control terminal of the supply transistor via a capacitive coupling.

In example 32, the subject matter of any of the examples 29 to 31 may optionally include controlling a current flowing through a common inflow amplifier transistor, wherein the immitance converter amplifier comprises the common inflow amplifier circuit comprising a common inflow amplifier transistor of the first conductivity type coupled between the output of the immitance converter amplifier and a further supply for a further supply potential.

In example 33, the subject matter of example 32 may optionally include controlling the current flowing through the common inflow amplifier transistor comprises controlling the current flowing through the common inflow amplifier transistor to be proportional to a control current flowing through the current mirror transistor.

In example 34, the subject matter of any of the examples 32 or 33 may optionally include the common inflow amplifier circuit being a cascoded common inflow amplifier circuit comprising a further common inflow amplifier transistor of the first conductivity type coupled between the output of the immitance converter amplifier and the common inflow amplifier transistor, wherein the method further comprises providing a control signal to the control terminal of the further common inflow amplifier transistor.

In example 35, the subject matter of any of the examples 32 to 34 may optionally include the immitance converter amplifier further comprising a common control amplifier circuit, the common control amplifier circuit and the common inflow amplifier circuit being capacitively cross-coupled, and wherein receiving the input signal comprises providing the input signal to at least one of an input of the common control amplifier circuit and an input of the common inflow amplifier circuit.

In example 36, the subject matter of example 35 may optionally include receiving the input signal comprising providing the input signal to the input of the common control amplifier circuit and to the input of the common inflow amplifier circuit.

Example 37 is an apparatus for amplifying an input signal, the apparatus comprising a means for receiving the input signal at an input of a circuit, the circuit comprising an immitance converter amplifier based on a plurality of transistors of a first conductivity type, and a supply transistor coupled between an output of the immitance converter amplifier and a supply for a supply potential, the supply transistor being a transistor of a second conductivity type complementary to the first type; and a means for providing a feedback signal based on an output signal at the output of the immitance converter amplifier to a control terminal of the supply transistor to stabilize a DC-output potential of the output of the immitance converter amplifier. In other words, the means for providing the feedback signal may be stabilizing the DC-output potential of the output of the immitance converter amplifier.

Example 38 is a machine readable storage medium including program code, when executed, to cause a machine to perform the method of any one of examples 29 to 36.

Example 39 is a machine readable storage including machine readable instructions, when executed, to implement a method or realize an apparatus as described in any pending example.

Example 40 is a computer program having a program code for performing any of the methods of examples 29 to 36, when the computer program is executed on a computer or processor.

Examples may, therefore, provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub-acts or sub-processes may be included and be part of such a single act or process, unless explicitly excluded.

The invention claimed is:

1. A circuit comprising:
an immitance converter amplifier based on a plurality of transistors of a first conductivity type; and
a supply transistor coupled between an output of the immitance converter amplifier and a supply for a supply potential, the supply transistor being a transistor of a second conductivity type complementary to the first type,
wherein the output of the immitance converter amplifier is fed back via an output voltage control circuit to a control terminal of the supply transistor.

2. The circuit according to claim 1, wherein the supply transistor is coupled with an inflow terminal and a sink terminal between the supply for the supply potential and the output of the immitance converter amplifier.

3. The circuit according to claim 1, wherein the output voltage control circuit is configured to generate a negative feedback loop.

4. The circuit according to claim 3, wherein the output voltage control circuit is adapted to stabilize a DC-output potential of the output of the immitance converter amplifier.

5. The circuit according to claim 1, wherein the output voltage control circuit comprises a controllable voltage source coupled between the output of the immitance converter amplifier and the control terminal of the supply transistor.

6. A circuit comprising:
an immitance converter amplifier based on a plurality of transistors of a first conductivity type; and
a supply transistor coupled between an output of the immitance converter amplifier and a supply for a supply potential, the supply transistor being a transistor of a second conductivity type complementary to the first type,
wherein an input of the circuit is coupled to the control terminal of the supply transistor.

7. The circuit according to claim 6, wherein a capacitor is coupled between the input of the circuit and the control terminal of the supply transistor.

8. A circuit comprising:
an immitance converter amplifier based on a plurality of transistors of a first conductivity type; and
a supply transistor coupled between an output of the immitance converter amplifier and a supply for a supply potential, the supply transistor being a transistor of a second conductivity type complementary to the first type,
wherein the immitance converter amplifier comprises a common inflow amplifier circuit comprising a common inflow amplifier transistor of the first conductivity type coupled between the output of the immitance converter amplifier and a further supply for a further supply potential, the circuit further comprising a bias control circuit coupled to a control terminal of the common inflow amplifier transistor and configured to control a current flowing through the common inflow amplifier transistor.

9. The circuit according to claim 8, wherein the bias control circuit comprises a current mirror circuit comprising a current mirror transistor, a control terminal of which is coupled to the control terminal of the common inflow amplifier transistor, wherein the current mirror circuit is configured to control the current flowing through the common inflow amplifier transistor to be proportional to a control current flowing through the current mirror transistor.

10. The circuit according to claim 9, wherein the common inflow amplifier circuit is a cascoded common inflow amplifier circuit comprising a further common inflow amplifier transistor of the first conductivity type coupled between the output of the immitance converter amplifier and the common inflow amplifier transistor, wherein the current mirror circuit is a cascoded current mirror circuit comprising a further current mirror transistor coupled between a node, to which the control terminal of the current mirror transistor is coupled, and the current mirror transistor, and wherein the control terminal of the further current mirror transistor is coupled to a control terminal of the further common inflow amplifier transistor.

11. The circuit according to claim 10, wherein the control terminal of the further current mirror transistor is coupled to the control terminal of the further common inflow amplifier transistor via coupling circuit, the coupling circuit comprising a decoupling circuit element to weaken a coupling of the control terminal of the further current mirror transistor to the control terminal of the further common inflow transistor.

12. The circuit according to claim 11, wherein the decoupling circuit element of the coupling circuit is a resistor.

13. The circuit according to claim 11, wherein the coupling circuit further comprises a further decoupling element forming a series connection with the decoupling element of the coupling circuit coupled between the control terminal of the further current mirror transistor and the control terminal of the further common inflow transistor, wherein the series connection further comprises a node configured to be coupled to a bias potential.

14. The circuit according to claim 13, wherein the further decoupling element of the coupling circuit is a resistor.

15. The circuit according to claim 8, wherein the control terminal of the common inflow amplifier transistor is coupled to an input of the circuit, and wherein the bias control circuit comprises a current mirror decoupling circuit element to decouple the current circuit mirror circuit from the input of the circuit.

16. The circuit according to claim 15, wherein the current mirror decoupling circuit element comprises a resistor.

17. The circuit according to claim 8, wherein the immitance converter amplifier further comprises a common control amplifier circuit, the common control amplifier circuit and the common inflow amplifier circuit being capacitively cross-coupled, wherein an input of the circuit is capacitively coupled to at least one of an input of the common control amplifier circuit and an input of the common inflow amplifier circuit.

18. The circuit according to claim 17, wherein the input of the circuit is capacitively coupled to the input of the common control amplifier circuit and to the input of the common inflow amplifier circuit.

19. An integrated circuit comprising:
a substrate comprising a circuit, the circuit comprising an immitance converter amplifier based on a plurality of transistors of a first conductivity type, and a supply transistor coupled between an output of the immitance converter amplifier and a supply for a supply potential, the supply transistor being a transistor of a second conductivity type complementary to the first type,
wherein the output of the immitance converter amplifier is fed back via an output voltage control circuit to a control terminal of the supply transistor.

20. A receiver or a transceiver comprising:
an antenna port; and
a circuit comprising an immitance converter amplifier based on a plurality of transistors of a first conductivity type, and a supply transistor coupled between an output of the immitance converter amplifier and a supply for a supply potential, the supply transistor being a transistor of a second conductivity type complementary to the first type, wherein the output of the immitance converter amplifier is fed back via an output voltage control circuit to a control terminal of the supply transistor,
wherein the antenna port is coupled to an input of the circuit and is configured to couple to an antenna.

21. A method for amplifying an input signal, the method comprising:
receiving the input signal at an input of a circuit, the circuit comprising an immitance converter amplifier based on a plurality of transistors of a first conductivity type, and a supply transistor coupled between an output of the immitance converter amplifier and a supply for a supply potential, the supply transistor being a transistor of a second conductivity type complementary to the first type; and
providing a feedback signal based on an output signal at the output of the immitance converter amplifier to a control terminal of the supply transistor to stabilize a DC-output potential of the output of the immitance converter amplifier.

22. The method according to claim 21, wherein receiving the input signal comprises providing the input signal to the control terminal of the supply transistor.

23. The method according to claim 22, wherein providing the input signal to the control terminal of the supply transistor comprises providing the input signal to the control terminal of the supply transistor via a capacitive coupling.

* * * * *